(12) United States Patent
Wang et al.

(10) Patent No.: US 11,275,103 B2
(45) Date of Patent: Mar. 15, 2022

(54) CALIBRATION METHOD, SYSTEM AND DEVICE OF ON-WAFER S PARAMETER OF VECTOR NETWORK ANALYZER

(71) Applicant: THE 13TH RESEARCH INSTITUTE OF CHINA ELECTRONICS TECHNOLOGY GROUP CORPORATION, Shijiazhuang (CN)

(72) Inventors: Yibang Wang, Shijiazhuang (CN); Aihua Wu, Shijiazhuang (CN); Faguo Liang, Shijiazhuang (CN); Chen Liu, Shijiazhuang (CN); Xuefeng Zou, Shijiazhuang (CN); Zhifu Hu, Shijiazhuang (CN); Jian Cao, Shijiazhuang (CN); Ye Huo, Shijiazhuang (CN)

(73) Assignee: The 13th Research Institute of China Electronics Technology Group Corporation, Shijiazhuang (CN)

(*) Notice: Subject to any disclaimer, the term of this patent is extended or adjusted under 35 U.S.C. 154(b) by 0 days.

(21) Appl. No.: 17/026,190

(22) Filed: Sep. 19, 2020

(65) Prior Publication Data

US 2021/0003622 A1    Jan. 7, 2021

Related U.S. Application Data

(63) Continuation of application No. PCT/CN2019/095441, filed on Jul. 10, 2019.

(30) Foreign Application Priority Data

May 22, 2019 (CN) .......................... 201910429556.5

(51) Int. Cl.
G01R 27/28 (2006.01)
G01R 35/00 (2006.01)

(52) U.S. Cl.
CPC .......... G01R 27/28 (2013.01); G01R 35/005 (2013.01)

(58) Field of Classification Search
CPC ...................................................... G01R 27/28
(Continued)

(56) References Cited

U.S. PATENT DOCUMENTS 6,836,743 B1 * 12/2004 Blackham ............ G01R 35/005
324/601
7,235,982 B1 * 6/2007 Shoulders .............. G01R 27/28
324/601
(Continued)

FOREIGN PATENT DOCUMENTS

CN      102279376 A    12/2011
CN      103364751 A    10/2013
(Continued)

*Primary Examiner* — Ricky Go
(74) *Attorney, Agent, or Firm* — Slater Matsil, LLP

(57) ABSTRACT

The disclosure provides a calibration method, a system and a device of an on-wafer S parameter of a vector network analyzer. The method comprises the steps of: acquiring a first parameter of a first crosstalk calibration piece measured by the vector network analyzer; obtaining a main crosstalk error term based on the first parameter of the first crosstalk calibration piece and a calibration parameter of the first crosstalk calibration piece; acquiring a second parameter of a second crosstalk calibration piece measured by the vector network analyzer based on the main crosstalk error term; and obtaining a secondary crosstalk error term based on the second parameter of the second crosstalk calibration piece and a calibration parameter of the second crosstalk calibration piece, wherein the main crosstalk error term and the secondary crosstalk error term are used for calibrating the vector network analyzer.

13 Claims, 6 Drawing Sheets

(58) Field of Classification Search
USPC .......................................................... 702/107
See application file for complete search history.

(56) References Cited

U.S. PATENT DOCUMENTS

| | | | |
|---|---|---|---|
| 10,145,930 B1 | 12/2018 | Betts et al. | |
| 2004/0160228 A1* | 8/2004 | Jamneala | G01R 35/005 324/601 |
| 2005/0256658 A1* | 11/2005 | Anderson | G01R 35/005 702/90 |
| 2010/0318833 A1* | 12/2010 | Reichel | G01R 35/00 714/2 |
| 2012/0326737 A1* | 12/2012 | Wen | G01R 35/005 324/750.01 |

FOREIGN PATENT DOCUMENTS

| | | |
|---|---|---|
| CN | 104849585 A | 8/2015 |
| CN | 104931799 A | 9/2015 |
| CN | 107102284 A | 8/2017 |
| CN | 108614231 A | 10/2018 |
| CN | 109444717 A | 3/2019 |
| CN | 109444721 A | 3/2019 |
| CN | 109581259 A | 4/2019 |

\* cited by examiner

Short_Short

Open_Open

Resistor_Resistor

Thru

CALIBRATION METHOD, SYSTEM AND DEVICE OF ON-WAFER S PARAMETER OF VECTOR NETWORK ANALYZER

CROSS-REFERENCE TO RELATED APPLICATIONS

This application is a continuation application of International Application No. PCT/CN2019/095441, filed on Jul. 10, 2019, which claims priority to Chinese Patent Application No. CN201910429556.5, filed on May 22, 2019. The disclosures of the aforementioned applications are hereby incorporated herein by reference in their entireties.

TECHNICAL FIELD

The disclosure belongs to the technical field of semiconductors, and particularly relates to a calibration method, system and device of an on-wafer S parameter of a vector network analyzer.

BACKGROUND

A 12-term system error model and an 8-term system error model are respectively used to characterize imperfections of system source/load matching, reflection/transmission tracking, directivity, isolation and so on, and have high accuracy in the low frequency on-wafer field (below 50 GHz), coaxial and waveguide field. So they have been widely used.

Along with the increase of the on-wafer test frequency, some system errors which can be neglected in a low-frequency band cannot be neglected in a high-frequency band, and the traditional 12-term system error model or 8-term error model has larger errors and inaccurate calibration when calibrating the on-wafer S parameters in the high-frequency band.

SUMMARY

These and other problems are generally solved or circumvented, and technical advantages are generally achieved, by embodiments of the present disclosure which provide a calibration method, system and device of an on-wafer S parameter of a vector network analyzer.

The embodiment of the disclosure provides a calibration method, system and device of an on-wafer S parameter of a vector network analyzer so as to solve the problem that the on-wafer S parameter is not accurately calibrated by a current system error model at a high frequency band.

A first aspect of embodiments of the present application provides a calibration method of an on-wafer S parameter of a vector network analyzer, comprising the steps of:

acquiring a first parameter of a first crosstalk calibration piece measured by the vector network analyzer;

obtaining a main crosstalk error term based on the first parameter of the first crosstalk calibration piece and a calibration parameter of the first crosstalk calibration piece, wherein the main crosstalk error term is a crosstalk error between a first probe and a second probe when the vector network analyzer measures a measured piece;

acquiring a second parameter of a second crosstalk calibration piece measured by the vector network analyzer based on the main crosstalk error term; and obtaining a secondary crosstalk error term based on the second parameter of the second crosstalk calibration piece and a calibration parameter of the second crosstalk calibration piece, wherein the main crosstalk error term and the secondary crosstalk error term are used for calibrating the vector network analyzer, and the secondary crosstalk error term is a residual crosstalk error between the first probe and the second probe with imperfect correction of the main crosstalk error term.

A second aspect of embodiments of the present application provides a calibration system of an on-wafer S parameter of a vector network analyzer, comprising: a non-transitory memory storage comprising instructions; and one or more processors in communication with the memory storage, where the one or more processors are configured to execute the instruction to perform:

acquiring a first parameter of a first crosstalk calibration piece measured by the vector network analyzer;

obtaining a main crosstalk error term based on the first parameter of the first crosstalk calibration piece and a calibration parameter of the first crosstalk calibration piece;

acquiring a second parameter of a second crosstalk calibration piece measured by the vector network analyzer based on the main crosstalk error term; and obtaining a secondary crosstalk error term based on the second parameter of the second crosstalk calibration piece and a calibration parameter of the second crosstalk calibration piece, wherein the main crosstalk error term and the secondary crosstalk error term are used for calibrating the vector network analyzer.

A third aspect of embodiments of the present application provides a terminal device comprising a memory, a processor and a computer program stored in the memory and executable on the processor, wherein the processor, when executing the computer program, causes the terminal device to perform the steps as described above.

A fourth aspect of embodiments of the present application provides a computer-readable storage medium storing a computer program which, when executed by a processor, performs the steps as described above.

In the disclosure, through adoption of the main crosstalk error term, correction is performed when the vector network analyzer measures the on-wafer S parameter of the measured piece, so that the main crosstalk error between the probes during measurement is solved; and through the secondary crosstalk error term, correction is performed when the vector network analyzer measures the on-wafer S parameter of the measured piece, and the residual error caused by the fact that the main crosstalk error term is not corrected well is solved, and the accuracy of on-wafer S parameter calibration is improved.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

In order to more clearly illustrate the technical solutions in the embodiments of the present application, the following description briefly introduces the drawings used in the embodiments or the prior art, and it is obvious that the drawings in the following description are only some embodiments of the present application, and that other drawings can be obtained from these drawings by a person skilled in the art without involving any inventive effort.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

In the following description, for purposes of explanation and not limitation, specific details are set forth such as a particular system architecture, techniques, etc. in order to provide a thorough understanding of the embodiments of the present application. However, it will be apparent to one skilled in the art that the present application may be practiced in other embodiments without these specific details. In other instances, detailed descriptions of well-known systems, installations, circuits, and methods are omitted so as not to obscure the description of the present application with unnecessary details.

The word "comprising" and any other variations thereof in the description, the claims of the present application and the above-mentioned drawings is intended to mean "including, but not limited to", and is intended to cover a non-exclusive inclusion. For example, a process, a method, or a system, a product, or a device that comprises a list of steps or elements are not limited to the listed steps or elements, but may optionally further comprise steps or elements not listed, or may optionally further comprise other steps or elements inherent to such process, method, product, or device. Furthermore, the terms "first", "second", and "third", and so on, are used for distinguishing between different objects and not for describing a particular order.

In order to illustrate the technical solutions described in this application, specific embodiments are described below.

Figure 1:
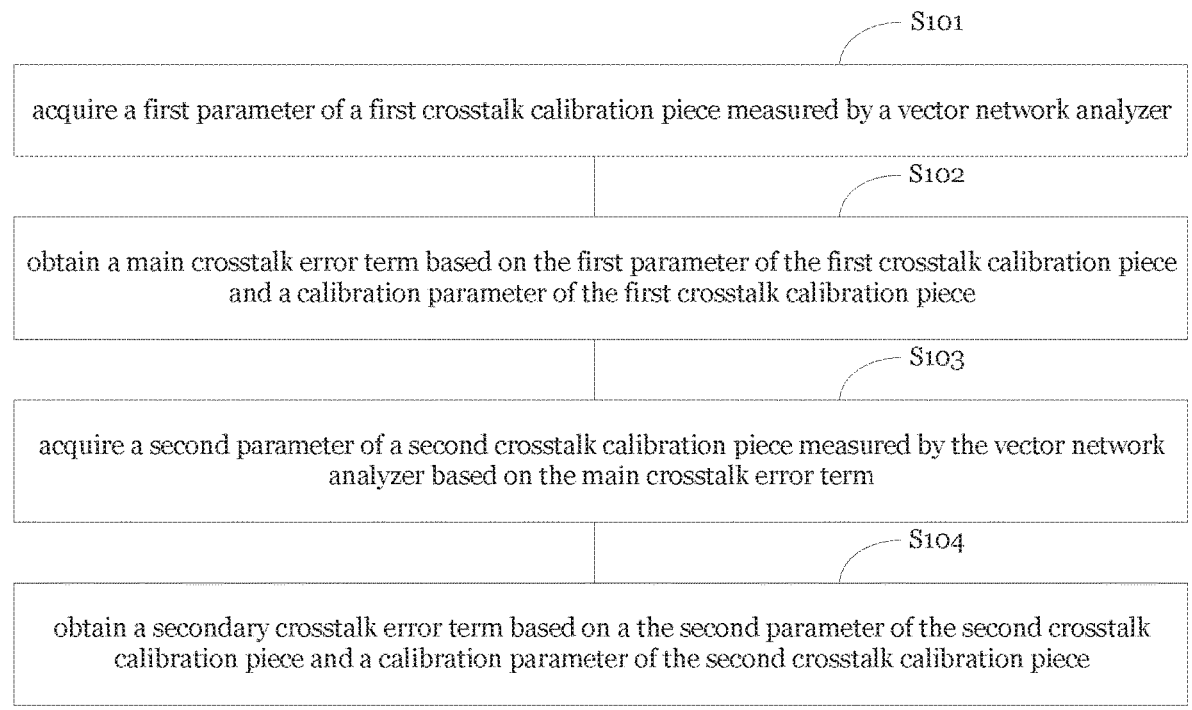
FIG. 1 is a flow diagram of a calibration method of an on-wafer S parameter of a vector network analyzer provided by an embodiment of the present application.

FIG. 1 is a flow diagram illustrating an implementation of a calibration method of an on-wafer S parameter of a vector network analyzer provided by an embodiment of the present disclosure. For ease of illustration, only those portions relevant to embodiments of the present disclosure are shown and described in detail below.

As shown in FIG. 1, an embodiment of the disclosure provides a calibration method of an on-wafer S parameter of a vector network analyzer, comprising the steps of:

S101, acquiring a first parameter of a first crosstalk calibration piece measured by the vector network analyzer; the first parameter of the first crosstalk calibration piece is the on-wafer S parameter of the first crosstalk calibration piece;

S102, obtaining a main crosstalk error term based on the first parameter of the first crosstalk calibration piece and a calibration parameter of the first crosstalk calibration piece, where the main crosstalk error term is a crosstalk error between a first probe and a second probe when the vector network analyzer measures a measured piece;

S103, acquiring a second parameter of a second crosstalk calibration piece measured by the vector network analyzer based on the main crosstalk error term; the second parameter of the second crosstalk calibration piece is the on-wafer S parameter of the second crosstalk calibration piece; and S104, obtaining a secondary crosstalk error term based on the second parameter of the second crosstalk calibration piece and a calibration parameter of the second crosstalk calibration piece, where the main crosstalk error term and the secondary crosstalk error term are used for calibrating the vector network analyzer, and the secondary crosstalk error term is a residual crosstalk error between the first probe and the second probe with imperfect correction of the main crosstalk error term.

In an embodiment of the present application, the first crosstalk calibration piece and the second crosstalk calibration piece may be the same crosstalk calibration piece or different crosstalk calibration pieces. The first crosstalk calibration piece may comprise one kind of crosstalk calibration piece or a multiple of crosstalk calibration pieces. The second crosstalk calibration piece may comprise one kind of crosstalk calibration piece or a multiple of crosstalk calibration pieces. The process of the calibration is as follows: the vector network analyzer measures a calibration piece with a known calibration parameter to obtain a measured parameter; then a difference is obtained through comparing the known calibration parameter and the measured parameter; and then error term is calculated via error term model. After calibration, the vector network analyzer may perform a measurement of the on-wafer S parameter of another measured piece to obtain a measured parameter, and then an actual and accurate on-wafer S parameter is calculated via the measured parameter and the error term.

In an embodiment of the present application, the first parameter of the first crosstalk calibration piece is obtained by measuring the first crosstalk calibration piece by the vector network analyzer based on a main error model, and the main error model is an 8-term error model or a 12-term error model obtained by performing a model calibration on the vector network analyzer by using a non-crosstalk calibration piece.

In an embodiment of the present application, the main error model employs an 8-term error model and may be obtained using SOLT (Short-Open-Load-Thru), LRRM (Line-Reflect-Reflect-Match), SOLR (Short-Open-Load-Reciprocal), LRM (Line-Reflect-Match), TRL (Thru-Reflect-Line), or Multiline TRL (Thru-Reflect-Line) calibration methods. An 8-term error model can be obtained firstly by performing calibration of co-axis or waveguide port of the system, and then the S parameter of the probe is measured, and the 8-term error model is obtained by calculation in cascade.

Figure 2:
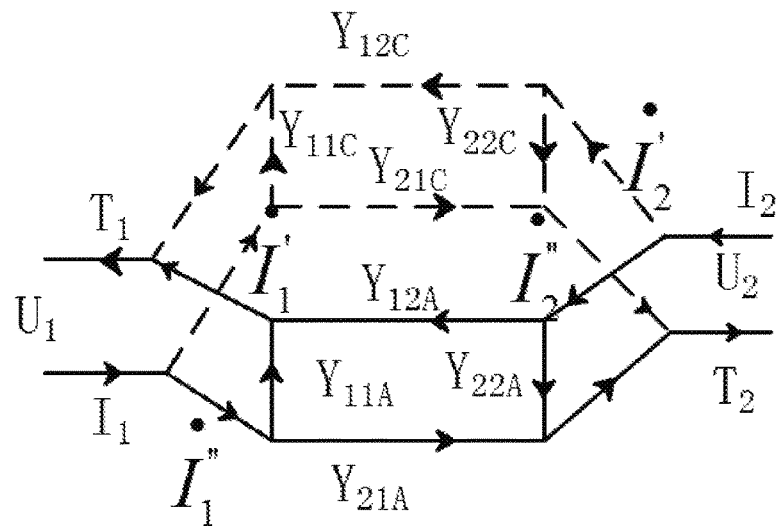
FIG. 2 is a schematic diagram of the structure of a main crosstalk error term model provided by an embodiment of the present application.

As shown in FIG. 2, in an embodiment of the present application, S102 comprises:

obtaining the main crosstalk error term by the first parameter of the first crosstalk calibration piece and the calibration parameter of the first crosstalk calibration piece based on a main crosstalk error term model, where the main crosstalk error term model can be obtained by the following algorithm:

$$Y_C = \begin{bmatrix} Y_{C11} & Y_{C12} \\ Y_{C21} & Y_{C22} \end{bmatrix}$$

$$Y_A = \begin{bmatrix} Y_{A11} & Y_{A12} \\ Y_{A21} & Y_{A22} \end{bmatrix}$$

$$\begin{bmatrix} I'_1 \\ I'_2 \end{bmatrix} = Y_C \begin{bmatrix} U_1 \\ U_2 \end{bmatrix}$$

$$\begin{bmatrix} I''_1 \\ I''_2 \end{bmatrix} = Y_A \begin{bmatrix} U_1 \\ U_2 \end{bmatrix}$$

$Y_A$ and $Y_C$ are in parallel to obtain $$\begin{bmatrix} I_1 \\ I_2 \end{bmatrix} = \begin{bmatrix} I'_1 \\ I'_2 \end{bmatrix} + \begin{bmatrix} I''_1 \\ I''_2 \end{bmatrix} = Y_C \begin{bmatrix} U_1 \\ U_2 \end{bmatrix} + Y_A \begin{bmatrix} U_1 \\ U_2 \end{bmatrix} = (Y_C + Y_A) \begin{bmatrix} U_1 \\ U_2 \end{bmatrix};$$

Therefore, $Y_T = Y_C + Y_A$, that is $$\begin{bmatrix} Y_{C11} & Y_{C12} \\ Y_{C21} & Y_{C22} \end{bmatrix} = \begin{bmatrix} Y_{T11} & Y_{T12} \\ Y_{T21} & Y_{T22} \end{bmatrix} - \begin{bmatrix} Y_{A11} & Y_{A12} \\ Y_{A21} & Y_{A22} \end{bmatrix};$$

where, $Y_{C11}$, $Y_{C12}$, $Y_{C21}$ and $Y_{C22}$ are four elements of the main crosstalk error term; $Y_{T11}$, $Y_{T12}$, $Y_{T21}$ and $Y_{T22}$ are four elements of the first parameter of the first crosstalk calibration piece; and $Y_{A11}$, $Y_{A12}$, $Y_{A21}$ and $Y_{A22}$ are four elements of the calibration parameter of the first crosstalk calibration piece; $I_1$ is a total current at a first port of a parallel network; $I_2$ is a total current at a second port of the parallel network; $I'_1$ is a current at a first port of a crosstalk error term network; $I'_2$ is a current at a second port of the crosstalk error term network; $I''_1$ is a current at a first port of a crosstalk calibration piece network; $I''_2$ is a current at a second port of the crosstalk calibration piece network; $U_1$ is a voltage at the first port; and $U_2$ is a voltage at the second port.

In an embodiment of the present application, S103 comprises:

acquiring an initial parameter of the second crosstalk calibration piece measured by the vector network analyzer, where the initial parameter of the second crosstalk calibration piece is obtained by measuring the second crosstalk calibration piece by the vector network analyzer based on a main error model, and the main error model is an 8-term error model or a 12-term error model obtained by performing a model calibration on the vector network analyzer by using a non-crosstalk calibration piece; and correcting the initial parameter by the main crosstalk error term to obtain the second parameter.

Figure 3:
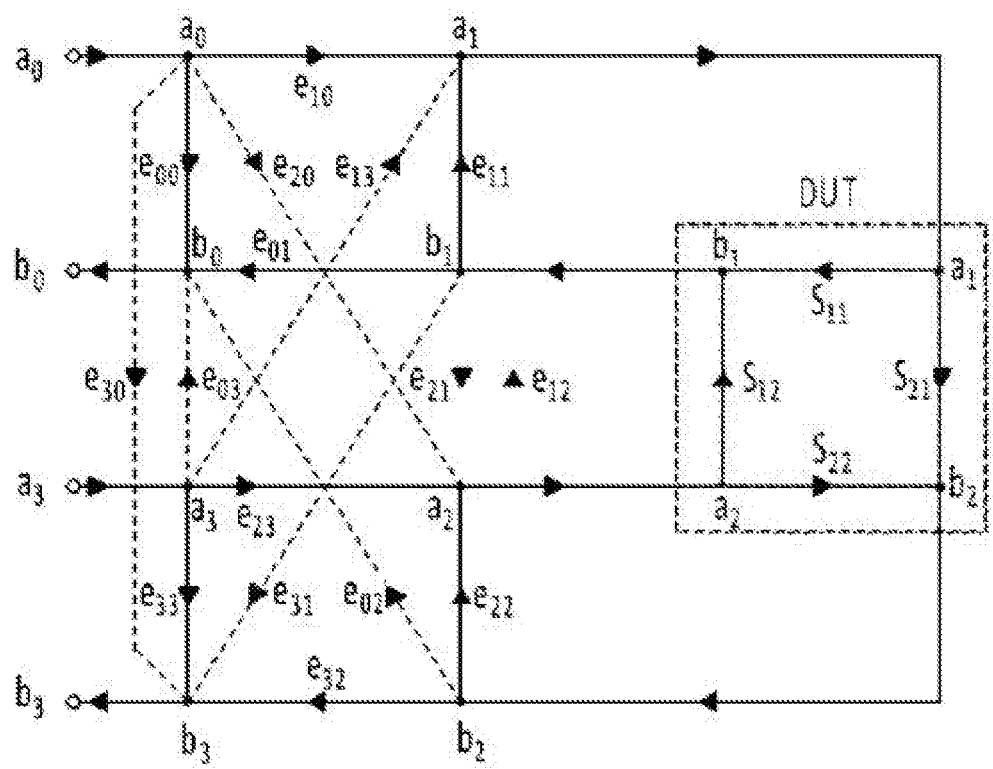
FIG. 3 is a structurally schematic diagram of a secondary crosstalk error term model provided by an embodiment of the present application.
Figure 4:
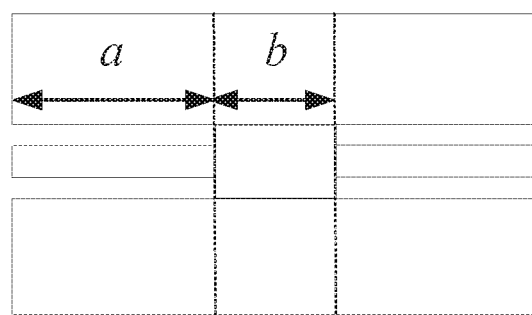
FIG. 4 is a structurally exemplary diagram of a Short-Short crosstalk calibration piece provided by an embodiment of the present application.
Figure 5:
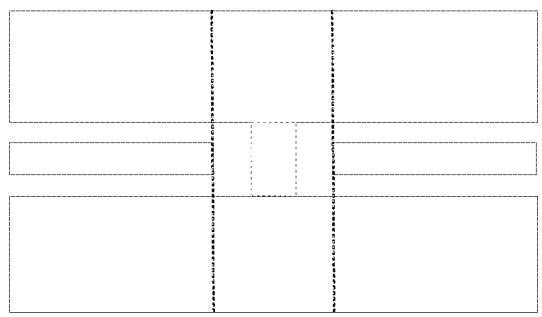
FIG. 5 is a structurally exemplary diagram of an Open-Open crosstalk calibration piece provided by an embodiment of the present application.
Figure 6:
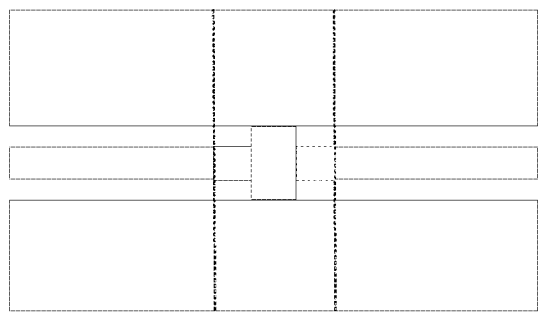
FIG. 6 is a structurally exemplary diagram of a Resistor-Resistor crosstalk calibration piece provided by an embodiment of the present application.
Figure 7:
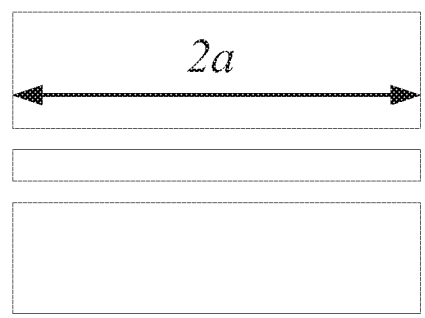
FIG. 7 is a structurally exemplary diagram of a through transmission line provided by an embodiment of the present application.

As shown in FIG. 3, in an embodiment of the present application, S104 comprises:

obtaining the secondary crosstalk error term by the second parameter of the second crosstalk calibration piece and a calibration parameter of the second crosstalk calibration piece based on a secondary crosstalk error term model, where the secondary crosstalk error term model can be obtained by the following algorithm:

$$\begin{bmatrix} b_0 \\ b_1 \\ b_2 \\ b_3 \end{bmatrix} = E \begin{bmatrix} a_0 \\ a_3 \\ a_1 \\ a_2 \end{bmatrix} = \begin{bmatrix} e_{00} & e_{03} & e_{01} & e_{02} \\ e_{30} & e_{33} & e_{31} & e_{32} \\ e_{10} & e_{13} & e_{11} & e_{12} \\ e_{20} & e_{23} & e_{21} & e_{22} \end{bmatrix} \begin{bmatrix} a_0 \\ a_3 \\ a_1 \\ a_2 \end{bmatrix} = \begin{bmatrix} E_1 & E_2 \\ E_3 & E_4 \end{bmatrix} \begin{bmatrix} a_0 \\ a_3 \\ a_1 \\ a_2 \end{bmatrix};$$

$$\begin{bmatrix} b_0 \\ b_3 \\ a_0 \\ a_3 \end{bmatrix} = T \begin{bmatrix} a_1 \\ a_2 \\ b_1 \\ b_2 \end{bmatrix} = \begin{bmatrix} t_0 & t_1 & t_4 & t_5 \\ t_2 & t_3 & t_6 & t_7 \\ t_8 & t_9 & t_{12} & t_{13} \\ t_{10} & t_{11} & t_{14} & t_{15} \end{bmatrix} \begin{bmatrix} a_1 \\ a_2 \\ b_1 \\ b_2 \end{bmatrix} = \begin{bmatrix} T_1 & T_2 \\ T_3 & T_4 \end{bmatrix} \begin{bmatrix} a_1 \\ a_2 \\ b_1 \\ b_2 \end{bmatrix};$$

$$\begin{bmatrix} S_{a11} & S_{a21} & 1 & & -S_{m11}S_{a11} & -S_{m11}S_{a21} & -S_{m12}S_{a11} & -S_{m12}S_{a21} & -S_{m11} & & -S_{m12} & \\ S_{a12} & S_{a22} & 1 & & -S_{m11}S_{a12} & -S_{m11}S_{a22} & -S_{m12}S_{a12} & -S_{m12}S_{a22} & & -S_{m11} & & -S_{m12} \\ & & & S_{a11} & S_{a21} & 1 & -S_{m21}S_{a11} & -S_{m21}S_{a21} & -S_{m22}S_{a11} & -S_{m22}S_{a21} & -S_{m21} & & -S_{m22} & \\ & & & S_{a12} & S_{a22} & 1 & -S_{m21}S_{a12} & -S_{m21}S_{a22} & -S_{m22}S_{a12} & -S_{m22}S_{a22} & & -S_{m21} & & -S_{m22} \end{bmatrix} \begin{bmatrix} t_0 \\ t_1 \\ \vdots \\ t_{15} \end{bmatrix} = 0$$

-continued $$T = \begin{bmatrix} t_0 & t_1 & t_4 & t_5 \\ t_2 & t_3 & t_6 & t_7 \\ t_8 & t_9 & t_{12} & t_{13} \\ t_{10} & t_{11} & t_{14} & t_{15} \end{bmatrix} = \begin{bmatrix} T_1 & T_2 \\ T_3 & T_4 \end{bmatrix}$$

$$= \frac{1}{\Delta} \begin{bmatrix} e_{01}\Delta + e_{00}(e_{13}e_{21} - e_{23}e_{11}) + & e_{02}\Delta + e_{00}(e_{13}e_{22} - e_{23}e_{12}) + & e_{00}e_{23} - e_{03}e_{20}, & e_{03}e_{10} - e_{00}e_{13} \\ e_{03}(e_{20}e_{11} - e_{10}e_{21}), & e_{03}(e_{20}e_{12} - e_{10}e_{22}), & & \\ e_{31}\Delta + e_{30}(e_{13}e_{21} - e_{23}e_{11}) + & e_{32}\Delta + e_{30}(e_{13}e_{22} - e_{23}e_{12}) + & e_{30}e_{23} - e_{33}e_{20}, & e_{33}e_{10} - e_{30}e_{13} \\ e_{33}(e_{20}e_{11} - e_{10}e_{21}), & e_{33}(e_{20}e_{12} - e_{10}e_{22}), & & \\ e_{13}e_{21} - e_{23}e_{11}, & e_{13}e_{22} - e_{23}e_{12}, & e_{23}, & -e_{13} \\ e_{20}e_{11} - e_{10}e_{21}, & e_{20}e_{12} - e_{10}e_{22}, & -e_{20}, & e_{10} \end{bmatrix}$$

where, $S_{mxy}$ is the second parameter of the second crosstalk calibration piece; $S_{aij}$ is the calibration parameter of the second crosstalk calibration piece; $e_{10}$, $e_{01}$, $e_{00}$, $e_{11}$, $e_{23}$, $e_{32}$, $e_{12}$, and $e_{21}$ are defined error terms; $e_{03}$, $e_{30}$, $e_{20}$, $e_{02}$, $e_{13}$ and $e_{31}$ are six elements of the secondary crosstalk error term; $\Delta = e_{10}e_{32} - e_{13}e_{20}$; $a_0$, $b_0$, $a_2$ and $b_2$ are voltage waves corrected by the main error model and the main crosstalk error term; $a_1$, $b_1$, $a_2$ and $b_2$ are voltage waves of the measured piece; and T is a transmission scattering matrix.

In a specific application, a calibration reference plane and a measurement reference plane are in a same reference plane, and a secondary crosstalk error term model is established. The secondary crosstalk error term model is a 16-term error model, and 10 terms in the 16-term error model are set with parameters, and only the remaining 6 terms, namely the secondary crosstalk error terms, need to be solved. At the moment, e10=e01=1; e00=e11=0; e23=e32=1; and e22=e33=0. Considering that the crosstalk between the probes has been characterized in the previous step, e12=e21=0. There are six unknowns to be solved, including e03=e30, e20=e02, e13=e31.

In an embodiment of the present application, S104 further comprises:

S105, acquiring an initial S parameter of a measured piece measured by the vector network analyzer, where the initial S parameter is obtained by measurement of the vector network analyzer based on a main error model, and the main error model is an 8-term error model or a 12-term error model obtained by performing a model calibration on the vector network analyzer by using a non-crosstalk calibration piece;

S106, correcting the initial S parameter by the main crosstalk error term to obtain a candidate S parameter;

S107, correcting the candidate S parameter by the secondary crosstalk error term to obtain an on-wafer S parameter of the measured piece;

where, the candidate S parameter is obtained by a formula $S_m(T_3 S_a + T_4) = (T_1 S_a + T_2)$, where $S_a$ is a calibration S parameter of the measured piece.

The on-wafer S parameter is obtained by a formula $S = (T_1 - S_m T_3)^{-1}(S_m T_4 - T_2)$; $S_m$ is a set of candidate S parameters; S is the on-wafer S parameter; and T is a transmission scattering matrix.

In an embodiment of the application, when the number of the crosstalk calibration piece is at least two, a main crosstalk error term and a secondary crosstalk error term are calculated respectively by using an orthogonal autoregressive algorithm.

In the present embodiment, a crosstalk standard piece can be selected from an open-open, a short-short, a resistor-resistor, an open-short, a resistor-open, a resistor-short standard piece, or a reciprocal structure of the above standard piece.

In the embodiment, in the process of correcting the main crosstalk error term and the secondary crosstalk error term, one crosstalk calibration piece or a plurality of crosstalk calibration pieces can be used, and the accuracy calculated by using only one crosstalk calibration piece is greatly influenced by random errors. In order to improve the extraction accuracy of crosstalk errors, a plurality of crosstalk calibration pieces can be measured at the moment, and the random error of a single crosstalk calibration piece is reduced by using an orthogonal autoregressive algorithm, and the measurement accuracy of crosstalk error terms is improved, and the measurement accuracy of on-wafer S parameters at a terahertz frequency band is further improved.

The orthogonal autoregressive algorithm is shown below:

$$y_i = f_i(x_i + \delta_i, \beta) - \varepsilon_i;$$

where in the formula above, i represents an $i^{th}$ observation in the $n^{th}$ measurements, and $f_i$ represents a measurement model (known) in regard to the relationship between a quantity $\beta$ to be estimated and an independent variable $x_i$ (known), and $\varepsilon_i$ and $\delta_i$ represents a measurement error of an observation value $y_i$ and the independent variable $x_i$, which is also a desired reduction in the measurement process.

Then, an optimal quantity $\beta$ to be estimated can be obtained as follows:

$$\sum_{i=1}^{n} \left( \varepsilon_i^T \omega_{\varepsilon_i} \varepsilon_i + \delta_i^T \omega_{\delta_i} \delta_i \right)$$

where in the formula, $\omega_\varepsilon$ and $\omega_\delta$ are weighting factors, here set to be equal-weighted, and $\omega_\varepsilon$, $\omega_\delta$ become an identity matrix; and the above formula may be equivalent to $$\sum_{i=1}^{n} (y_i - f_i(x_i + \delta_i, \beta) - \varepsilon_i)^2$$

It should be understood that the sequence numbers of the steps in the above-described embodiments are not meant to imply a sequential order of execution, and that the order of execution of the processes should be determined by their function and inherent logic, and should not be construed as limiting the implementation of the embodiments of the present application in any way.

For ease of understanding, the following is a case.

In order to verify the newly established 18-item error model, 3 mm frequency band and 220 GHz-325 GHz calibration pieces and crosstalk calibration pieces are developed, and some of the calibration pieces are shown schematically in FIG. 4-FIG. 7. The calibration pieces are divided into a Multiline TRL calibration piece and a crosstalk calibration piece. A Coplanar Waveguide (CPW) transmission line with a straight-through length of 400 µm is designed in the Multiline TRL calibration piece, and the rest extra lengths are 100 µm, 300 µm, 500 µm, 2000 µm, 5000 µm, 7000 µm, and 11000 µm, and the reflection standard is Short-Short; and the crosstalk standards are Open-Open, Short-Short, Resistor-Resistor, Open-Short, Resistor-Short, Resistor-Open, and a single port offset of the crosstalk standard piece is half of the straight-through, namely 200 µm. The measured piece is a passive attenuator, left port and right port are connected in series at 50 ohms, and upper floor and lower floor are connected in parallel at 75 ohms, so that the attenuator structure is most sensitive to crosstalk.

The general scheme is as follows: firstly, calibrating a basic on-wafer vector network analyzer by adopting a Multiline TRL calibration method to obtain an 8-term error model, and then performing a measurement to obtain a measurement result of a passive attenuator which is not corrected by crosstalk; secondly, measuring one kind of crosstalk calibration piece by using a calibrated on-wafer vector network analyzer to obtain four main crosstalk error terms; and thirdly, measuring other crosstalk standard pieces to obtain a secondary crosstalk error term; and finally, obtaining a measurement result corrected by the crosstalk of the passive attenuator according to the crosstalk term. After the measurement is finished, the passive attenuator needs to be subjected to electromagnetic field simulation to obtain S parameter of the passive attenuator, and measurement results and simulation results before and after crosstalk correction are compared.

Figure 8:
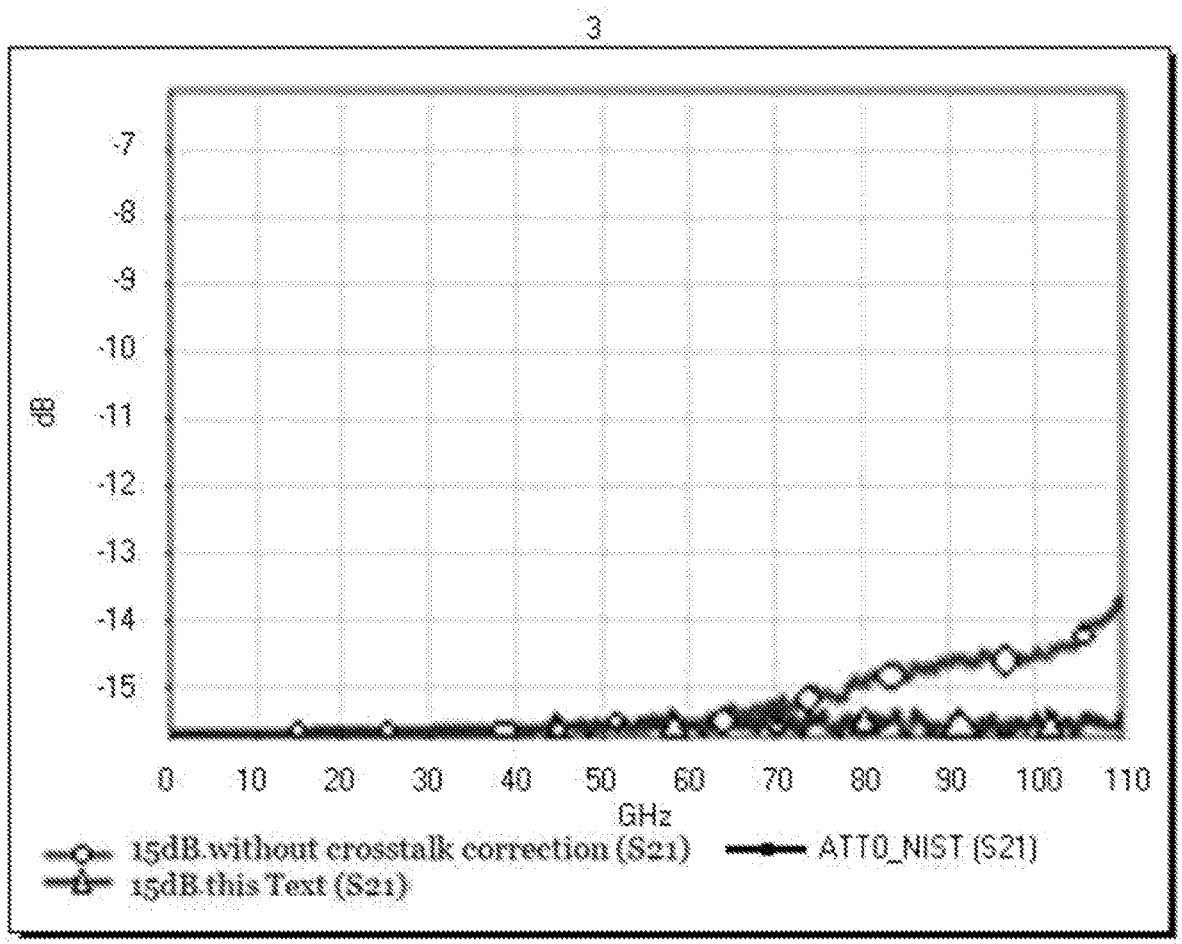
FIG. 8 is an exemplary diagram of simulation results of the present application and the prior art at a 3 mm frequency band provided by an embodiment of the present application.
Figure 9:
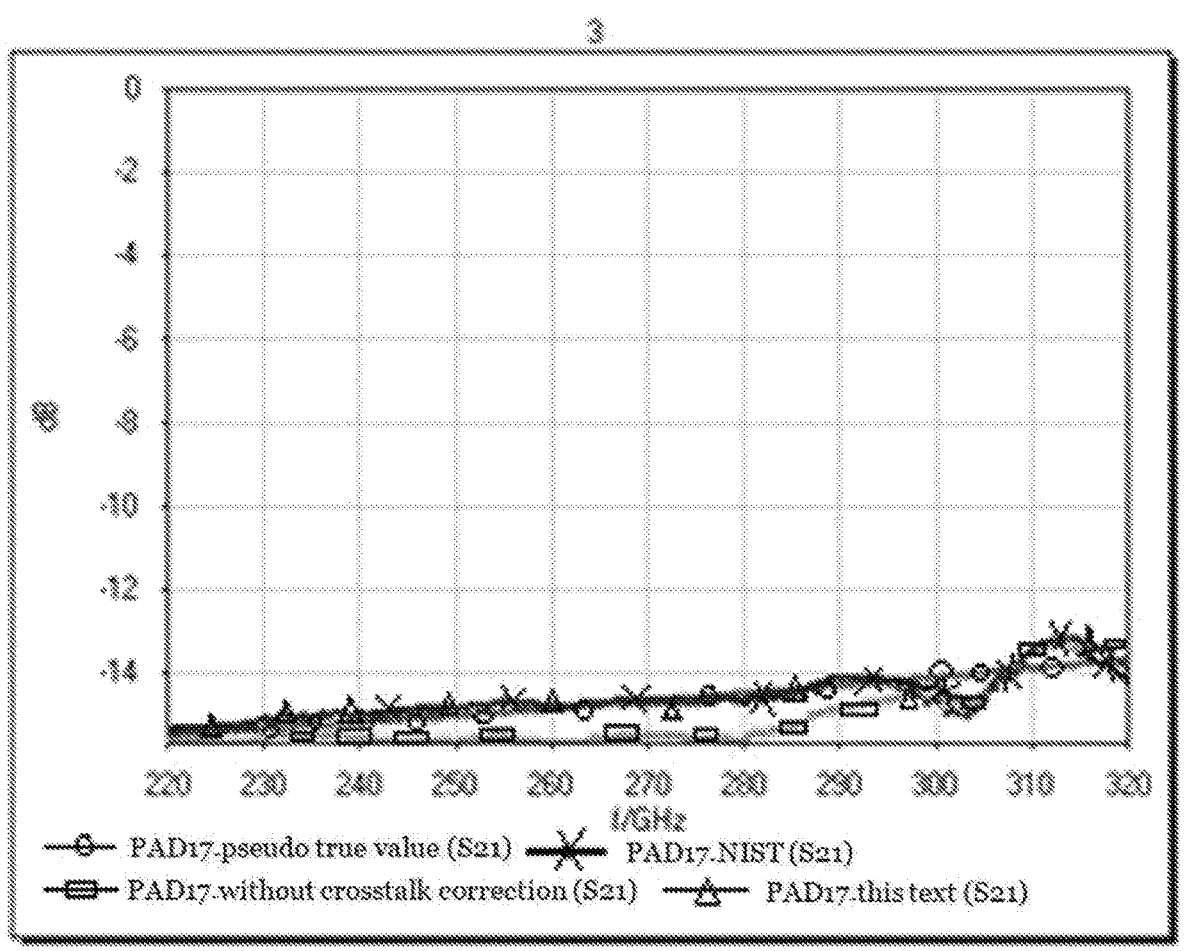
FIG. 9 is a structurally exemplary diagram of the simulation results of the present application and the prior art at a 220 GHz-325 GHz frequency band provided by an embodiment of the present application.

Measurement Results:

The passive attenuator is measured by the on-wafer vector network analyzer to obtain a S parameter without crosstalk correction, and the S parameter of the final measured piece is obtained according to a 18-term system error model. The measurement results are shown in FIG. 8. The suffix "XX_whithout crosstalk correction" is the measurement result of the 8-term error model without crosstalk correction; the suffix "_this text" is the measurement result of crosstalk correction by using the error model in this text; the suffix "_NIST" is the measurement result of crosstalk correction made by NIST (National Institute of Standards and Technology, the top level of the world) (NIST measurement results can be used as a reference to evaluate the correction effect). Theoretical analysis shows that the passive attenuator itself is simple in structure, and the transmission gain should be relatively flat in the whole frequency range. As can be seen from FIG. 8, the transmission amplitude of the measurement result corrected by the error model is relatively flat, which accords with the physical essence, and the maximum improvement in the high frequency range is about 1.2 dB, which is basically consistent with the NIST result. FIG. 9 shows that the results in the 220 GHz-325 GHz frequency band are well consistent with NIST. Compared with the results without crosstalk correction, the maximum improvement in the whole frequency band is 1.0 dB. The measurement results well coincide with the simulation results. As for the 300 GHz attenuator measurement, there is a slight fluctuation, which should be caused by the attenuator processing technology.

Figure 10:
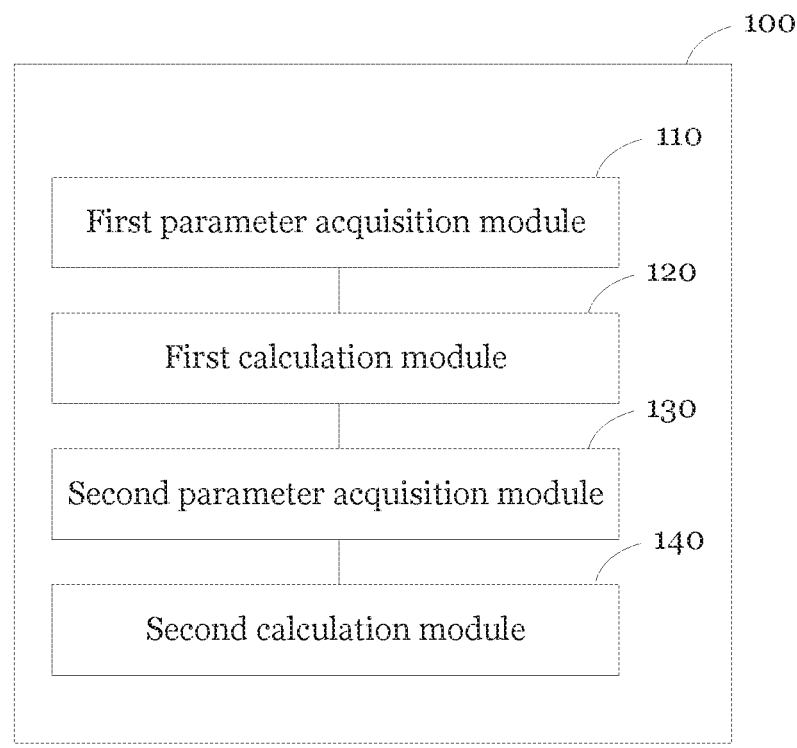
FIG. 10 is a structurally exemplary diagram of a calibration system of an on-wafer S parameter of a vector network analyzer provided by an embodiment of the present application.

As shown in FIG. 10, an embodiment of the present application provides a calibration system 100 of an on-wafer S parameter of a vector network analyzer for performing the method steps in the embodiment corresponding to FIG. 1, comprising:

a first parameter acquisition module no configured for acquiring a first parameter of a first crosstalk calibration piece measured by the vector network analyzer;

a first calculation module 120 configured for obtaining a main crosstalk error term based on the first parameter of the first crosstalk calibration piece and a calibration parameter of the first crosstalk calibration piece, where the main crosstalk error term is a crosstalk error between a first probe and a second probe when the vector network analyzer measures a measured piece;

a second parameter acquisition module 130 configured for acquiring a second parameter of a second crosstalk calibration piece measured by the vector network analyzer based on the main crosstalk error term; and a second calculation module 140 configured for obtaining a secondary crosstalk error term based on a second parameter of the second crosstalk calibration piece and a calibration parameter of the second crosstalk calibration piece, where the main crosstalk error term and the secondary crosstalk error term are used for calibrating the vector network analyzer, and the secondary crosstalk error term is a residual crosstalk error between a first probe and a second probe with imperfect correction of the main crosstalk error term.

In an embodiment of the present application, the first parameter of the first crosstalk calibration piece is obtained by measuring the first crosstalk calibration piece by the vector network analyzer based on a main error model, and the main error model is an 8-term error model or a 12-term error model obtained by performing a model calibration on the vector network analyzer by using a non-crosstalk calibration piece.

In an embodiment of the present application, the first calculation module 120 is configured for:

obtaining a main crosstalk error term by the first parameter of the first crosstalk calibration piece and the calibration parameter of the first crosstalk calibration piece based on a main crosstalk error term model, where the main crosstalk error term model is as follows:

$$\begin{bmatrix} Y_{C11} & Y_{C12} \\ Y_{C21} & Y_{C22} \end{bmatrix} = \begin{bmatrix} Y_{T11} & Y_{T12} \\ Y_{T21} & Y_{T22} \end{bmatrix} - \begin{bmatrix} Y_{A11} & Y_{A12} \\ Y_{A21} & Y_{A22} \end{bmatrix}$$

wherein, $Y_{C11}$, $Y_{C12}$, $Y_{C21}$ and $Y_{C22}$ are four elements of the main crosstalk error term; $Y_{T11}$, $Y_{T12}$, $Y_{T21}$ and $Y_{T22}$ are four elements of the first parameter of the first crosstalk calibration piece; and $Y_{A11}$, $Y_{A12}$, $Y_{A21}$ and $Y_{A22}$ are four elements of the calibration parameter of the first crosstalk calibration piece.

In an embodiment of the application, the second parameter acquisition module 130 comprises:

a parameter acquisition unit configured for acquiring an initial parameter of the second crosstalk calibration piece measured by the vector network analyzer, wherein the initial parameter of the second crosstalk calibration piece is obtained by measuring the second crosstalk calibration piece by the vector network analyzer based on the main error model, and the main error model is an 8-term error model or a 12-term error model obtained by performing a model calibration on the vector network analyzer by using a non-crosstalk calibration piece; and a second parameter calculation unit configured for correcting the initial parameter by the main crosstalk error term to obtain a second parameter.

In an embodiment of the present application, the second calculation module 140 is configured for:

obtaining the secondary crosstalk error term by the second parameter of the second crosstalk calibration piece and a calibration parameter of the second crosstalk calibration piece based on a secondary crosstalk error term model, wherein the secondary crosstalk error term model is as follows:

$$\begin{bmatrix} S_{a11} & S_{a21} & & 1 & -S_{m11}S_{a11} & -S_{m11}S_{a21} & -S_{m12}S_{a11} & -S_{m12}S_{a21} & -S_{m11} & & -S_{m12} & \\ S_{a12} & S_{a22} & & 1 & -S_{m11}S_{a12} & -S_{m11}S_{a22} & -S_{m12}S_{a12} & -S_{m12}S_{a22} & & -S_{m11} & & -S_{m12} \\ & & S_{a11} & S_{a21} & 1 & -S_{m21}S_{a11} & -S_{m21}S_{a21} & -S_{m22}S_{a11} & -S_{m22}S_{a21} & -S_{m21} & & -S_{m22} & \\ & & S_{a12} & S_{a22} & 1 & -S_{m21}S_{a12} & -S_{m21}S_{a22} & -S_{m22}S_{a12} & -S_{m22}S_{a22} & & -S_{m21} & & -S_{m22} \end{bmatrix} \begin{bmatrix} t_0 \\ t_1 \\ \vdots \\ t_{15} \end{bmatrix} = 0$$

$$T = \begin{bmatrix} t_0 & t_1 & t_4 & t_5 \\ t_2 & t_3 & t_6 & t_7 \\ t_8 & t_9 & t_{12} & t_{13} \\ t_{10} & t_{11} & t_{14} & t_{15} \end{bmatrix} = \begin{bmatrix} T_1 & T_2 \\ T_3 & T_4 \end{bmatrix}$$

$$= \frac{1}{\Delta} \begin{bmatrix} e_{01}\Delta + e_{00}(e_{13}e_{21} - e_{23}e_{11}) + & e_{02}\Delta + e_{00}(e_{13}e_{22} - e_{23}e_{12}) + & & \\ e_{03}(e_{20}e_{11} - e_{10}e_{21}), & e_{03}(e_{20}e_{12} - e_{10}e_{22}), & e_{00}e_{23} - e_{03}e_{20}, & e_{03}e_{10} - e_{00}e_{13} \\ e_{31}\Delta + e_{30}(e_{13}e_{21} - e_{23}e_{11}) + & e_{32}\Delta + e_{30}(e_{13}e_{22} - e_{23}e_{12}) + & & \\ e_{33}(e_{20}e_{11} - e_{10}e_{21}), & e_{33}(e_{20}e_{12} - e_{10}e_{22}), & e_{30}e_{23} - e_{33}e_{20}, & e_{33}e_{10} - e_{30}e_{13} \\ e_{13}e_{21} - e_{23}e_{11}, & e_{13}e_{22} - e_{23}e_{12}, & e_{23}, & -e_{13} \\ e_{20}e_{11} - e_{10}e_{21}, & e_{20}e_{12} - e_{10}e_{22}, & -e_{20}, & e_{10} \end{bmatrix}$$

wherein, $S_{mxy}$ is the second parameter of the second crosstalk calibration piece; $S_{aij}$ the calibration parameter of the second crosstalk calibration piece; $e_{10}$, $e_{01}$, $e_{00}$, $e_{11}$, $e_{23}$, $e_{32}$, $e_{12}$ $e_{21}$ are defined error terms; $e_{03}$, $e_{30}$, $e_{20}$, $e_{02}$, $e_{13}$ and $e_{31}$ are six elements of the secondary crosstalk error term; $\Delta = e_{10}e_{23} - e_{13}e_{20}$; T is a transmission scattering matrix; $e_{10} = e_{01} = 1$; $e_{00} = e_{11} = 0$; $e_{23} = e_{32} = 1$; $e_{22}e_{33} = 0$; $e_{03} = e_{30}$, $e_{20} = e_{02}$, $e_{13} = e_{31}$.

In an embodiment of the application, the second calculation module 140 further comprises:

an initial S parameter acquisition module configured for acquiring an initial S parameter of a measured piece measured by the vector network analyzer, wherein the initial S parameter is obtained by measurement of the vector network analyzer based on a main error model, and the main error model is an 8-term error model or a 12-term error model obtained by performing a model calibration on the vector network analyzer by using a non-crosstalk calibration piece;

a candidate S parameter acquisition module configured for correcting the initial S parameter by the main crosstalk error term to obtain a candidate S parameter;

an on-wafer S parameter acquisition module configured for correcting the candidate S parameter by the secondary crosstalk error term to obtain an on-wafer S parameter of the measured piece;

where, the on-wafer S parameter is obtained by a formula $S = (T_1 - S_m T_3)^{-1}(S_m T_4 - T_2)$; $S_m$ is a set of candidate S parameters; S is the on-wafer S parameter; and T is a transmission scattering matrix.

In an embodiment of the application, when the number of the crosstalk calibration piece is at least two, the main crosstalk error term and the secondary crosstalk error term are calculated respectively by using an orthogonal autoregressive algorithm.

It can be clearly understood by a person skilled in the art that, for convenience and conciseness of description, only the division of the above-mentioned functional modules is exemplified. In practical applications, the above-mentioned distribution of functions can be completed by different functional modules according to requirements, i.e. the system for calibrating an on-wafer S parameter of a vector network analyzer is divided into different functional modules so as to complete all or part of the functions described above. The functional modules in the embodiments may be integrated in one processing unit, may be physically separate from each other, or may be integrated in one unit by two or more units, either in the form of hardware or in the form of software functional units. In addition, the specific names of the functional modules are merely for convenience of mutual distinction, and are not used to limit the scope of protection of the present application. The specific working process of the module in the system for calibrating an on-wafer S parameter of a vector network analyzer can refer to the corresponding process in method embodiment 1, which is not described in detail herein.

Figure 11:
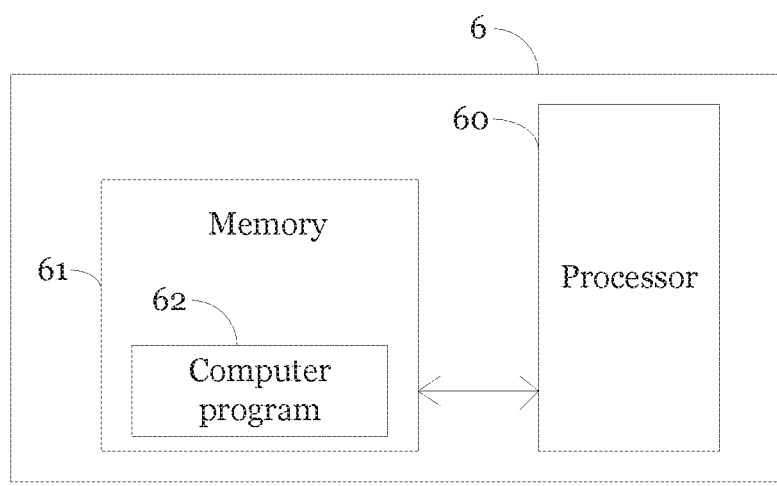
FIG. 11 is a schematic diagram of a terminal device provided by an embodiment of the present application.

FIG. 11 is a schematic diagram of a terminal device provided in an embodiment of the present application. As shown in FIG. 11, the terminal device 6 of this embodiment comprises a processor 60, a memory 61, and a computer program 62 stored in the memory 61 and executable on the processor 60. The processor 60, when executing the computer program 62, implements the steps in the embodiments described in embodiment 1, e.g. steps S101 to S104 shown in FIG. 1. Alternatively, the processor 60, when executing the computer program 62, performs functions of various modules/units in various system embodiments as described in embodiment 2, such as the functions of the module no to module 140 shown in FIG. 10.

The terminal device 6 refers to a terminal having a data processing capability, including but not limited to a computer, a workstation, a server, even some smart phones, palmtops, tablet computers, personal digital assistants (PDAs), smart televisions (Smart TVs) and the like with excellent performance. Operating systems are typically installed on terminal devices, including but not limited to Windows operating system, LINUX operating system, Android operating system, Symbian operating system, Windows mobile operating system, iOS operating system, etc. Specific examples of the terminal device 6 are listed in detail above, and those skilled in the art will appreciate that the terminal device is not limited to the examples listed above.

The terminal device may include, but is not limited to, a processor 60, and a memory 61. Those skilled in the art will appreciate that FIG. 11 is merely an example of a terminal device 6 and is not to be construed as limiting the terminal device 6, and may include more or fewer components than shown, or may combine certain components, or different components, e.g., the terminal device 6 may also include input and output devices, a network access device, a bus, etc.

The processor 60 may be a central processing unit (CPU) or other general purpose processor, a Digital Signal Processor (DSP), an Application Specific Integrated Circuit (ASIC), Field-Programmable Gate Array (FPGA) or other programmable logic devices, discrete gate or transistor logic devices, discrete hardware components, etc. A general purpose processor may be a microprocessor or the processor may be any conventional processor or the like.

The memory 61 may be an internal storage unit of the terminal device 6, such as a hard disk or a memory of the terminal device 6. The memory 61 may also be an external storage device of the terminal device 6, such as a plug-in hard disk, a Smart Media Card (SMC), a Secure Digital (SD) card, a Flash Card, etc. provided on the terminal device 6. Further, the memory 61 may also comprise both an internal storage unit and an external storage device of the terminal device 6. The memory 61 is used for storing the computer program, and other programs and data required by the terminal device 6. The memory 61 may also be used to temporarily store data that has been or will be output.

An embodiment of the present application also provides a computer-readable storage medium storing a computer program which, when executed by a processor, performs the steps of the embodiments described in Embodiment 1, such as step S101 to step S104 shown in FIG. 1. Alternatively, the computer program, when executed by a processor, performs functions of various modules/units in various system embodiments as described in Embodiment 2, such as the functions of the module no to module 140 shown in FIG. 10.

The computer program as described may be stored in a computer-readable storage medium and performs the steps of the various method embodiments described above when executed by the processor. Therein, the computer program comprises computer program code, which may be in the form of source code, object code, executable files or some intermediate form, etc. The computer-readable medium may include: any entity or device capable of carrying the computer program code, recording media, U-disk, removable hard disk, magnetic disk, optical disk, computer memory, Read-Only Memory (ROM), Random Access Memory (RAM), electrical carrier wave signals, telecommunications signals, and software distribution media.

In the embodiments described above, particular emphasis has been placed on the description of the various embodiments, Embodiment 1 to Embodiment 4 may be combined in any combination, and new embodiments formed by the combination are also within the scope of the present application. Parts of an embodiment that are not described or illustrated in detail may be found in the description of other embodiments.

Those of ordinary skill in the art will recognize that the elements and algorithm steps described in connection with the embodiments disclosed herein may be implemented by an electronic hardware, or a combination of a computer software and an electronic hardware. Whether such functions are implemented by a hardware or a software depends upon the particular application and design constraints of the technical solutions. Skilled artisans may implement the described functions in varying ways for each particular application, but such implementation is not intended to exceed the scope of the present application.

In the embodiments provided herein, it should be understood that the disclosed terminal devices and methods may be implemented in other ways. For example, the system/terminal device embodiments described above are merely illustrative, e.g., a division of the modules or elements into only one logical function, and there may be additional divisions in actual implementation. For example, multiple elements or components may be combined or integrated into another system, or some features may be omitted, or not performed. Alternatively, the couplings or direct couplings or communicative connections shown or discussed with respect to one another may be indirect couplings or communicative connections via some interface, devices or units, and may be electrical, mechanical or otherwise.

The above-described embodiments are merely illustrative of the technical solutions of the present application and are not intended to be limiting thereof. Although the present application has been described in detail with reference to the foregoing embodiments, those skilled in the art will appreciate that the technical solutions of the above-mentioned embodiments can still be modified, or some of the technical features thereof can be equivalently substituted; and such modifications and substitutions do not cause the nature of the corresponding technical solution to depart from the spirit and scope of the embodiments of the present disclosure, and are intended to be included within the scope of this application.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A calibration method of an on-wafer S parameter of a vector network analyzer, comprising:

acquiring a first parameter of a first crosstalk calibration piece measured by the vector network analyzer;

obtaining a main crosstalk error term based on the first parameter of the first crosstalk calibration piece and a calibration parameter of the first crosstalk calibration piece, wherein the main crosstalk error term is a crosstalk error between a first probe and a second probe when the vector network analyzer measures a measured piece;

acquiring a second parameter of a second crosstalk calibration piece measured by the vector network analyzer based on the main crosstalk error term; and obtaining a secondary crosstalk error term based on the second parameter of the second crosstalk calibration piece and a calibration parameter of the second crosstalk calibration piece, wherein the main crosstalk error term and the secondary crosstalk error term are used for calibrating the vector network analyzer, and the secondary crosstalk error term is a residual crosstalk error between the first probe and the second probe with imperfect correction of the main crosstalk error term; and wherein obtaining the secondary crosstalk error term based on the second parameter of the second crosstalk calibration piece and the calibration parameter of the second crosstalk calibration piece comprises:

obtaining the secondary crosstalk error term by the second parameter of the second crosstalk calibration piece and the calibration parameter of the second crosstalk calibration piece based on a secondary crosstalk error term model, wherein the secondary crosstalk error term model is as follows:

$$\begin{bmatrix} S_{a11} & S_{a21} & & 1 & -S_{m11}S_{a11} & -S_{m11}S_{a21} & -S_{m12}S_{a11} & -S_{m12}S_{a21} & -S_{m11} & & -S_{m12} & \\ S_{a12} & S_{a22} & & 1 & -S_{m11}S_{a12} & -S_{m11}S_{a22} & -S_{m12}S_{a12} & -S_{m12}S_{a22} & -S_{m11} & & -S_{m12} & \\ & & S_{a11} & S_{a21} & 1 & -S_{m21}S_{a11} & -S_{m21}S_{a21} & -S_{m22}S_{a11} & -S_{m22}S_{a21} & -S_{m21} & & -S_{m22} \\ & & S_{a12} & S_{a22} & 1 & -S_{m21}S_{a12} & -S_{m21}S_{a22} & -S_{m22}S_{a12} & -S_{m22}S_{a22} & -S_{m21} & & -S_{m22} \end{bmatrix} \begin{bmatrix} t_0 \\ t_1 \\ \vdots \\ t_{15} \end{bmatrix} = 0$$

$$T = \begin{bmatrix} t_0 & t_1 & t_4 & t_5 \\ t_2 & t_3 & t_6 & t_7 \\ t_8 & t_9 & t_{12} & t_{13} \\ t_{10} & t_{11} & t_{14} & t_{15} \end{bmatrix} = \begin{bmatrix} T_1 & T_2 \\ T_3 & T_4 \end{bmatrix} =$$

$$\frac{1}{\Delta} \begin{bmatrix} e_{01}\Delta + e_{00}(e_{13}e_{21} - e_{23}e_{11}) + e_{03}(e_{20}e_{11} - e_{10}e_{21}), & e_{02}\Delta + e_{00}(e_{13}e_{22} - e_{23}e_{12}) + e_{03}(e_{20}e_{12} - e_{10}e_{22}), & e_{00}e_{23} - e_{03}e_{20}, & e_{03}e_{10} - e_{00}e_{13} \\ e_{31}\Delta + e_{30}(e_{13}e_{21} - e_{23}e_{11}) + e_{33}(e_{20}e_{11} - e_{10}e_{21}), & e_{32}\Delta + e_{30}(e_{13}e_{22} - e_{23}e_{12}) + e_{33}(e_{20}e_{12} - e_{10}e_{22}), & e_{30}e_{23} - e_{33}e_{20}, & e_{33}e_{10} - e_{30}e_{13} \\ e_{13}e_{21} - e_{23}e_{11}, & e_{13}e_{22} - e_{23}e_{12}, & e_{23}, & -e_{13} \\ e_{20}e_{11} - e_{10}e_{21}, & e_{20}e_{12} - e_{10}e_{22}, & -e_{20}, & e_{10} \end{bmatrix}$$

and wherein, $S_{mxy}$ is the second parameter of the second crosstalk calibration piece, $S_{aij}$ is the calibration parameter of the second crosstalk calibration piece, $e_{10}=e_{01}=1$, $e_{00}=e_{11}=0$, $e_{23}=e_{32}=1$, $e_{22}=e_{33}=0$, and $e_{12}=e_{21}=0$ are defined error terms, $e_{03}$, $e_{30}$, $e_{20}$, $e_{02}$, $e_{13}$ and $e_{31}$ are six elements of the secondary crosstalk error term, $e_{03}=e_{30}$, $e_{20}=e_{02}$, $e_{13}=e_{31}$, $\Delta=e_{10}e_{32}-e_{13}e_{20}$, and T is a transmission scattering matrix.

2. The calibration method according to claim 1, wherein the first parameter of the first crosstalk calibration piece is obtained by measuring the first crosstalk calibration piece by the vector network analyzer based on a main error model, and the main error model is an 8-term error model or a 12-term error model obtained by performing a model calibration on the vector network analyzer by using a non-crosstalk calibration piece.

3. The calibration method according to claim 2, wherein the calibration method, after obtaining the secondary crosstalk error term based on the second parameter of the second crosstalk calibration piece and the calibration parameter of the second crosstalk calibration piece, further comprise:

acquiring an initial S parameter of the measured piece measured by the vector network analyzer, wherein the initial S parameter is obtained by measurement of the vector network analyzer based on the main error model;

correcting the initial S parameter by the main crosstalk error term to obtain a candidate S parameter; and correcting the candidate S parameter by the secondary crosstalk error term to obtain the on-wafer S parameter of the measured piece; and wherein, the on-wafer S parameter is obtained by a formula $S=(T_1-S_mT_3)^{-1}(S_mT_4-T_2)$, $S_m$ is a set of candidate S parameters, S is the on-wafer S parameter, and T is a transmission scattering matrix.

4. The calibration method according to claim 1, wherein obtaining the main crosstalk error term based on the first parameter of the first crosstalk calibration piece and the calibration parameter of the first crosstalk calibration piece comprises:

obtaining the main crosstalk error term by the first parameter of the first crosstalk calibration piece and the calibration parameter of the first crosstalk calibration piece based on a main crosstalk error term model, wherein the main crosstalk error term model is as follows:

$$\begin{bmatrix} Y_{C11} & Y_{C12} \\ Y_{C21} & Y_{C22} \end{bmatrix} = \begin{bmatrix} Y_{T11} & Y_{T12} \\ Y_{T21} & Y_{T22} \end{bmatrix} - \begin{bmatrix} Y_{A11} & Y_{A12} \\ Y_{A21} & Y_{A22} \end{bmatrix},$$

wherein, $Y_{C11}$, $Y_{C12}$, $Y_{C21}$ and $Y_{C22}$ are four elements of the main crosstalk error term, $Y_{T11}$, $Y_{T12}$, $Y_{T21}$ and $Y_{T22}$ are four elements of the first parameter of the first crosstalk calibration piece, and $Y_{A11}$, $Y_{A12}$, $Y_{A21}$, and $Y_{A22}$ are four elements of the calibration parameter of the first crosstalk calibration piece.

5. The calibration method according to claim 4, wherein the calibration method, after obtaining the secondary crosstalk error term based on the second parameter of the second crosstalk calibration piece and the calibration parameter of the second crosstalk calibration piece, further comprises:

acquiring an initial S parameter of the measured piece measured by the vector network analyzer, wherein the initial S parameter is obtained by measurement of the vector network analyzer based on a main error model, and the main error model is an 8-term error model or a 12-term error model obtained by performing a model calibration on the vector network analyzer by using a non-crosstalk calibration piece;

correcting the initial S parameter by the main crosstalk error term to obtain a candidate S parameter; and correcting the candidate S parameter by the secondary crosstalk error term to obtain the on-wafer S parameter of the measured piece; and wherein, the on-wafer S parameter is obtained by a formula $S=(T_1-S_mT_3)^{-1}(S_mT_4-T_2)$, $S_m$ is a set of candidate S parameters, S is the on-wafer S parameter, and T is a transmission scattering matrix.

6. The calibration method according to claim 1, wherein acquiring the second parameter of the second crosstalk calibration piece measured by the vector network analyzer based on the main crosstalk error term, comprises:

acquiring an initial parameter of the second crosstalk calibration piece measured by the vector network analyzer, wherein the initial parameter of the second crosstalk calibration piece is obtained by measuring the second crosstalk calibration piece by the vector network analyzer based on a main error model, and the main error model is an 8-term error model or a 12-term error model obtained by performing a model calibration on the vector network analyzer by using a non-crosstalk calibration piece; and correcting the initial parameter by the main crosstalk error term to obtain the second parameter.

7. The calibration method according to claim 6, wherein the calibration method, after obtaining the secondary crosstalk error term based on the second parameter of the second crosstalk calibration piece and the calibration parameter of the second crosstalk calibration piece, further comprises:

acquiring an initial S parameter of the measured piece measured by the vector network analyzer, wherein the initial S parameter is obtained by measurement of the vector network analyzer based on the main error model;

correcting the initial S parameter by the main crosstalk error term to obtain a candidate S parameter; and correcting the candidate S parameter by the secondary crosstalk error term to obtain the on-wafer S parameter of the measured piece; and wherein, the on-wafer S parameter is obtained by a formula $S=(T_1-S_mT_3)^{-1}(S_mT_4-T_2)$, $S_m$ is a set of candidate S parameters, S is the on-wafer S parameter, and T is a transmission scattering matrix.

8. The calibration method according to claim 1, wherein the calibration method, after obtaining the secondary crosstalk error term based on the second parameter of the second crosstalk calibration piece and the calibration parameter of the second crosstalk calibration piece, further comprises:

acquiring an initial S parameter of the measured piece measured by the vector network analyzer, wherein the initial S parameter is obtained by measurement of the vector network analyzer based on a main error model, and the main error model is an 8-term error model or a 12-term error model obtained by performing a model calibration on the vector network analyzer by using a non-crosstalk calibration piece;

correcting the initial S parameter by the main crosstalk error term to obtain a candidate S parameter; and correcting the candidate S parameter by the secondary crosstalk error term to obtain the on-wafer S parameter of the measured piece; and wherein, the on-wafer S parameter is obtained by a formula $S=(T_1-S_mT_3)^{-1}(S_mT_4-T_2)$, $S_m$ is a set of candidate S parameters, S is the on-wafer S parameter, and T is a transmission scattering matrix.

9. The calibration method according to claim 1, wherein the calibration method, after obtaining the secondary crosstalk error term based on the second parameter of the second crosstalk calibration piece and the calibration parameter of the second crosstalk calibration piece, further comprises:

acquiring an initial S parameter of the measured piece measured by the vector network analyzer, wherein the initial S parameter is obtained by measurement of the vector network analyzer based on a main error model, and the main error model is an 8-term error model or a 12-term error model obtained by performing a model calibration on the vector network analyzer by using a non-crosstalk calibration piece;

correcting the initial S parameter by the main crosstalk error term to obtain a candidate S parameter; and correcting the candidate S parameter by the secondary crosstalk error term to obtain the on-wafer S parameter of the measured piece; and wherein, the on-wafer S parameter is obtained by a formula $S=(T_1-S_mT_3)^{-1}(S_mT_4-T_2)$, $S_m$ is a set of candidate S parameters, S is the on-wafer S parameter, and T is a transmission scattering matrix.

10. The calibration method according to claim 1, wherein one or more crosstalk calibration pieces are measured by the vector network analyzer, and when a number of the one or more crosstalk calibration pieces is at least two, the main crosstalk error term and the secondary crosstalk error term are calculated respectively by using an orthogonal autoregressive algorithm.

11. A calibration system of an on-wafer S parameter of a vector network analyzer, comprising:

a non-transitory memory storage comprising instructions; and one or more processors in communication with the memory storage, wherein the one or more processors are configured to execute the instruction to perform:

acquiring a first parameter of a first crosstalk calibration piece measured by the vector network analyzer;

obtaining a main crosstalk error term based on the first parameter of the first crosstalk calibration piece and a calibration parameter of the first crosstalk calibration piece, wherein the main crosstalk error term is a crosstalk error between a first probe and a second probe when the vector network analyzer measures a measured piece;

acquiring a second parameter of a second crosstalk calibration piece measured by the vector network analyzer based on the main crosstalk error term; and obtaining a secondary crosstalk error term based on the second parameter of the second crosstalk calibration piece and a calibration parameter of the second crosstalk calibration piece, wherein the main crosstalk error term and the secondary crosstalk error term are used for calibrating the vector network analyzer, and the secondary crosstalk error term is a residual crosstalk error between the first probe and the second probe with imperfect correction of the main crosstalk error term; and wherein obtaining the secondary crosstalk error term based on the second parameter of the second crosstalk calibration piece and the calibration parameter of the second crosstalk calibration piece comprises:

obtaining the secondary crosstalk error term by the second parameter of the second crosstalk calibration piece and the calibration parameter of the second crosstalk calibration piece based on a secondary crosstalk error term model, wherein the secondary crosstalk error term model is as follows:

$$\begin{bmatrix} S_{a11} & S_{a21} & & 1 & -S_{m11}S_{a11} & -S_{m11}S_{a21} & -S_{m12}S_{a11} & -S_{m12}S_{a21} & -S_{m11} & & -S_{m12} & \\ S_{a12} & S_{a22} & & 1 & -S_{m11}S_{a12} & -S_{m11}S_{a22} & -S_{m12}S_{a12} & -S_{m12}S_{a22} & & -S_{m11} & & -S_{m12} \\ & & S_{a11} & S_{a21} & 1 & -S_{m21}S_{a11} & -S_{m21}S_{a21} & -S_{m22}S_{a11} & -S_{m22}S_{a21} & -S_{m21} & & -S_{m22} & \\ & & S_{a12} & S_{a22} & 1 & -S_{m21}S_{a12} & -S_{m21}S_{a22} & -S_{m22}S_{a12} & -S_{m22}S_{a22} & & -S_{m21} & & -S_{m22} \end{bmatrix} \begin{bmatrix} t_0 \\ t_1 \\ \vdots \\ t_{15} \end{bmatrix} = 0$$

$$T = \begin{bmatrix} t_0 & t_1 & t_4 & t_5 \\ t_2 & t_3 & t_6 & t_7 \\ t_8 & t_9 & t_{12} & t_{13} \\ t_{10} & t_{11} & t_{14} & t_{15} \end{bmatrix} = \begin{bmatrix} T_1 & T_2 \\ T_3 & T_4 \end{bmatrix}$$

$$= \frac{1}{\Delta} \begin{bmatrix} e_{01}\Delta + e_{00}(e_{13}e_{21} - e_{23}e_{11}) + & e_{02}\Delta + e_{00}(e_{13}e_{22} - e_{23}e_{12}) + & & \\ e_{03}(e_{20}e_{11} - e_{10}e_{21}), & e_{03}(e_{20}e_{12} - e_{10}e_{22}), & e_{00}e_{23} - e_{03}e_{20}, & e_{03}e_{10} - e_{00}e_{13} \\ e_{31}\Delta + e_{30}(e_{13}e_{21} - e_{23}e_{11}) + & e_{32}\Delta + e_{30}(e_{13}e_{22} - e_{23}e_{12}) + & & \\ e_{33}(e_{20}e_{11} - e_{10}e_{21}), & e_{33}(e_{20}e_{12} - e_{10}e_{22}), & e_{30}e_{23} - e_{33}e_{20}, & e_{33}e_{10} - e_{30}e_{13} \\ e_{13}e_{21} - e_{23}e_{11}, & e_{13}e_{22} - e_{23}e_{12}, & e_{23}, & -e_{13} \\ e_{20}e_{11} - e_{10}e_{21}, & e_{20}e_{12} - e_{10}e_{22}, & -e_{20}, & e_{10} \end{bmatrix}$$

and wherein, $S_{mxy}$ is the second parameter of the second crosstalk calibration piece, $S_{aij}$ is the calibration parameter of the second crosstalk calibration piece, $e_{10}=e_{01}=1$, $e_{00}=e_{11}=0$, $e_{23}=e_{32}=1$, $e_{22}=e_{33}=0$, and $e_{12}=e_{21}=0$ are defined error terms, $e_{03}$, $e_{30}$, $e_{20}$, $e_{02}$, $e_{13}$ and $e_{31}$ are six elements of the secondary crosstalk error term, $e_{03}=e_{30}$, $e_{20}=e_{02}$, $e_{13}=e_{31}$, $\Delta=e_{10}e_{32}-e_{13}e_{20}$, and T is a transmission scattering matrix.

12. A terminal device comprising a memory, a processor and a computer program stored in the memory and executable on the processor, wherein the processor, when executing the computer program, causes the terminal device to perform:
acquiring a first parameter of a first crosstalk calibration piece measured by a vector network analyzer;
obtaining a main crosstalk error term based on the first parameter of the first crosstalk calibration piece and a calibration parameter of the first crosstalk calibration piece, wherein the main crosstalk error term is a crosstalk error between a first probe and a second probe when the vector network analyzer measures a measured piece;
acquiring a second parameter of a second crosstalk calibration piece measured by the vector network analyzer based on the main crosstalk error term; and
obtaining a secondary crosstalk error term based on the second parameter of the second crosstalk calibration piece and a calibration parameter of the second crosstalk calibration piece, wherein the main crosstalk error term and the secondary crosstalk error term are used for calibrating the vector network analyzer, and the secondary crosstalk error term is a residual crosstalk error between the first probe and the second probe with imperfect correction of the main crosstalk error term; and
wherein obtaining the secondary crosstalk error term based on the second parameter of the second crosstalk calibration piece and the calibration parameter of the second crosstalk calibration piece comprises:
obtaining the secondary crosstalk error term by the second parameter of the second crosstalk calibration piece and the calibration parameter of the second crosstalk calibration piece based on a secondary crosstalk error term model, wherein the secondary crosstalk error term model is as follows:

$$\begin{bmatrix} S_{a11} & S_{a21} & & 1 & -S_{m11}S_{a11} & -S_{m11}S_{a21} & -S_{m12}S_{a11} & -S_{m12}S_{a21} & -S_{m11} & & -S_{m12} & \\ S_{a12} & S_{a22} & & 1 & -S_{m11}S_{a12} & -S_{m11}S_{a22} & -S_{m12}S_{a12} & -S_{m12}S_{a22} & & -S_{m11} & & -S_{m12} \\ & & S_{a11} & S_{a21} & 1 & -S_{m21}S_{a11} & -S_{m21}S_{a21} & -S_{m22}S_{a11} & -S_{m22}S_{a21} & -S_{m21} & & -S_{m22} & \\ & & S_{a12} & S_{a22} & 1 & -S_{m21}S_{a12} & -S_{m21}S_{a22} & -S_{m22}S_{a12} & -S_{m22}S_{a22} & & -S_{m21} & & -S_{m22} \end{bmatrix} \begin{bmatrix} t_0 \\ t_1 \\ \vdots \\ t_{15} \end{bmatrix} = 0$$

$$T = \begin{bmatrix} t_0 & t_1 & t_4 & t_5 \\ t_2 & t_3 & t_6 & t_7 \\ t_8 & t_9 & t_{12} & t_{13} \\ t_{10} & t_{11} & t_{14} & t_{15} \end{bmatrix} = \begin{bmatrix} T_1 & T_2 \\ T_3 & T_4 \end{bmatrix} =$$

$$\frac{1}{\Delta} \begin{bmatrix} e_{01}\Delta + e_{00}(e_{13}e_{21} - e_{23}e_{11}) + e_{03}(e_{20}e_{11} - e_{10}e_{21}), & e_{02}\Delta + e_{00}(e_{13}e_{22} - e_{23}e_{12}) + e_{03}(e_{20}e_{12} - e_{10}e_{22}), & e_{00}e_{23} - e_{03}e_{20}, & e_{03}e_{10} - e_{00}e_{13} \\ e_{31}\Delta + e_{30}(e_{13}e_{21} - e_{23}e_{11}) + e_{33}(e_{20}e_{11} - e_{10}e_{21}), & e_{32}\Delta + e_{30}(e_{13}e_{22} - e_{23}e_{12}) + e_{33}(e_{20}e_{12} - e_{10}e_{22}), & e_{30}e_{23} - e_{33}e_{20}, & e_{33}e_{10} - e_{33}e_{13} \\ e_{13}e_{21} - e_{23}e_{11}, & e_{13}e_{22} - e_{23}e_{12}, & e_{23}, & -e_{13} \\ e_{20}e_{11} - e_{10}e_{21}, & e_{20}e_{12} - e_{10}e_{22}, & -e_{20}, & e_{10} \end{bmatrix}$$

and wherein, $S_{mxy}$ is the second parameter of the second crosstalk calibration piece, $S_{aij}$ is the calibration parameter of the second crosstalk calibration piece, $e_{10}=e_{01}=1$, $e_{00}=e_{11}=0$, $e_{23}=e_{32}=1$, $e_{22}=e_{33}=0$, and $e_{12}=e_{21}=0$ are defined error terms, $e_{03}$, $e_{30}$, $e_{20}$, $e_{02}$, $e_{13}$ and $e_{31}$ are six elements of the secondary crosstalk error term, $e_{03}=e_{30}$, $e_{20}=e_{02}$, $e_{13}=e_{31}$, $\Delta=e_{10}e_{32}-e_{13}e_{20}$, and T is a transmission scattering matrix.

13. A non-transitory computer-readable medium containing computer instructions stored therein for causing a computer processor to perform step of:

acquiring a first parameter of a first crosstalk calibration piece measured by a vector network analyzer;

obtaining a main crosstalk error term based on the first parameter of the first crosstalk calibration piece and a calibration parameter of the first crosstalk calibration piece, wherein the main crosstalk error term is a crosstalk error between a first probe and a second probe when the vector network analyzer measures a measured piece;

acquiring a second parameter of a second crosstalk calibration piece measured by the vector network analyzer based on the main crosstalk error term; and obtaining a secondary crosstalk error term based on the second parameter of the second crosstalk calibration piece and a calibration parameter of the second crosstalk calibration piece, wherein the main crosstalk error term and the secondary crosstalk error term are used for calibrating the vector network analyzer, and the secondary crosstalk error term is a residual crosstalk error between the first probe and the second probe with imperfect correction of the main crosstalk error term; and wherein obtaining the secondary crosstalk error term based on the second parameter of the second crosstalk calibration piece and the calibration parameter of the second crosstalk calibration piece comprises:

obtaining the secondary crosstalk error term by the second parameter of the second crosstalk calibration piece and the calibration parameter of the second crosstalk calibration piece based on a secondary crosstalk error term model, wherein the secondary crosstalk error term model is as follows:

$$\begin{bmatrix} S_{a11} & S_{a21} & & & 1 & -S_{m11}S_{a11} & -S_{m11}S_{a21} & -S_{m12}S_{a11} & -S_{m12}S_{a21} & -S_{m11} & & -S_{m12} \\ S_{a12} & S_{a22} & & & 1 & -S_{m11}S_{a12} & -S_{m11}S_{a22} & -S_{m12}S_{a12} & -S_{m12}S_{a22} & -S_{m11} & & -S_{m12} \\ & & S_{a11} & S_{a21} & 1 & -S_{m21}S_{a11} & -S_{m21}S_{a21} & -S_{m22}S_{a11} & -S_{m22}S_{a21} & -S_{m21} & & -S_{m22} \\ & & S_{a12} & S_{a22} & 1 & -S_{m21}S_{a12} & -S_{m21}S_{a22} & -S_{m22}S_{a12} & -S_{m22}S_{a22} & & -S_{m21} & -S_{m22} \end{bmatrix} \begin{bmatrix} t_0 \\ t_1 \\ \vdots \\ t_{15} \end{bmatrix} = 0$$

$$T = \begin{bmatrix} t_0 & t_1 & t_4 & t_5 \\ t_2 & t_3 & t_6 & t_7 \\ t_8 & t_9 & t_{12} & t_{13} \\ t_{10} & t_{11} & t_{14} & t_{15} \end{bmatrix} = \begin{bmatrix} T_1 & T_2 \\ T_3 & T_4 \end{bmatrix} =$$

$$\frac{1}{\Delta} \begin{bmatrix} e_{01}\Delta + e_{00}(e_{13}e_{21}-e_{23}e_{11}) + e_{03}(e_{20}e_{11}-e_{10}e_{21}), & e_{02}\Delta + e_{00}(e_{13}e_{22}-e_{23}e_{12}) + e_{03}(e_{20}e_{12}-e_{10}e_{22}), & e_{00}e_{23} - e_{03}e_{20}, & e_{03}e_{10} - e_{00}e_{13} \\ e_{31}\Delta + e_{30}(e_{13}e_{21}-e_{23}e_{11}) + e_{33}(e_{20}e_{11}-e_{10}e_{21}), & e_{32}\Delta + e_{30}(e_{13}e_{22}-e_{23}e_{12}) + e_{33}(e_{20}e_{12}-e_{10}e_{22}), & e_{30}e_{23} - e_{33}e_{20}, & e_{33}e_{10} - e_{33}e_{13} \\ e_{13}e_{21} - e_{23}e_{11}, & e_{13}e_{22} - e_{23}e_{12}, & e_{23}, & -e_{13} \\ e_{20}e_{11} - e_{10}e_{21}, & e_{20}e_{12} - e_{10}e_{22}, & -e_{20}, & e_{10} \end{bmatrix}$$

and wherein, $S_{mxy}$ is the second parameter of the second crosstalk calibration piece, $S_{aij}$ is the calibration parameter of the second crosstalk calibration piece, $e_{10}=e_{01}=1$, $e_{00}=e_{11}=0$, $e_{23}=e_{32}=1$, $e_{22}=e_{33}=0$, and $e_{12}=e_{21}=0$ are defined error terms, $e_{03}$, $e_{30}$, $e_{20}$, $e_{02}$, $e_{13}$ and $e_{31}$ are six elements of the secondary crosstalk error term, $e_{03}=e_{30}$, $e_{20}=e_{02}$, $e_{13}=e_{31}$, $\Delta=e_{10}e_{32}-e_{13}e_{20}$, and T is a transmission scattering matrix.

* * * * *